(12) United States Patent
Kwon et al.

(10) Patent No.: US 7,663,083 B2
(45) Date of Patent: Feb. 16, 2010

(54) IMAGE SENSOR MODULE HAVING ELECTRIC COMPONENT AND FABRICATION METHOD THEREOF

(75) Inventors: Jong-oh Kwon, Suwon-si (KR); Yoon-chul Son, Suwon-si (KR); Kyu-dong Jung, Suwon-si (KR); Woon-bae Kim, Suwon-si (KR)

(73) Assignees: Samsung Electronics Co., Ltd., Suwon-si (KR); Samsung Electro-Mechanics Co., Ltd, Suwon-si (KR)

( * ) Notice: Subject to any disclaimer, the term of this patent is extended or adjusted under 35 U.S.C. 154(b) by 0 days.

(21) Appl. No.: 12/185,910

(22) Filed: Aug. 5, 2008

(65) Prior Publication Data
US 2009/0166511 A1 Jul. 2, 2009

(30) Foreign Application Priority Data
Dec. 27, 2007 (KR) .................... 10-2007-0139234

(51) Int. Cl.
*H01L 23/52* (2006.01)
(52) U.S. Cl. .................... 250/208.1; 250/239; 257/433; 257/693

(58) Field of Classification Search .............. 250/208.1, 250/239, 216; 257/433, 678, 690, 692, 693, 257/784; 348/340, 374
See application file for complete search history.

(56) References Cited

U.S. PATENT DOCUMENTS

2007/0013058 A1* 1/2007 Choi et al. .................. 257/723
2008/0278621 A1* 11/2008 Cho et al. .................... 348/374

* cited by examiner

*Primary Examiner*—Kevin Pyo
(74) *Attorney, Agent, or Firm*—Sughrue Mion, PLLC

(57) ABSTRACT

An image sensor module capable of facilitating an electrical and mechanical connection of an electric component and a fabrication thereof are disclosed. The image sensor module includes a sensor chip; at least one lens disposed above the sensor chip; at least one electric component disposed with respect to the at least one lens to adjust optical characteristics of the at least one lens; a housing accommodating and closing up the sensor chip, the at least one lens and the at least one electric component, and having an opening to expose the at least one lens to an outside thereof; and a wiring part longitudinally disposed on an inner surface of the housing, and including at least one conducting wire having a first connecting terminal exposed to the outside of the housing to allow the at least one conducting wire to electrically connect a terminal pad of the at least one electric component with an external electronic device and a second connecting terminal connected to the terminal pad of the at least one electric component.

19 Claims, 6 Drawing Sheets

IMAGE SENSOR MODULE HAVING ELECTRIC COMPONENT AND FABRICATION METHOD THEREOF

CROSS-REFERENCE TO RELATED PATENT APPLICATION

This application claims priority under 35 U.S.C. §119(a) from Korean Patent Application No. 10-2007-0139234 filed on Dec. 27, 2007 in the Korean Intellectual Property Office, the disclosure of which is incorporated herein by reference.

BACKGROUND OF THE INVENTION

1. Field of the Invention

The present invention relates to an image sensor module, which is used in an electronic device requiring a high resolution of pixels and a high precision image, such as a bio device, a mobile robot, a camera phone, etc. More particularly, the present invention relates to an image sensor module capable of facilitating an electrical and mechanical connection of an electric component mounted with respect to lenses, and a fabrication method thereof.

2. Description of the Related Art

Generally, an electronic device, such as bio device, a mobile robot, a camera phone, etc. has an image sensor module, which can take a photograph of a certain object. In recent, with a trend of the electronic device to increase the number of pixels and improve a performance in a high level, there has been actively developed an image sensor module in which a plurality of lenses are used and at the same time, an electric component is mounted to the plurality of lenses to adjust optical characteristics thereof, such as an automatic focusing function, a zoom function, an optical image stabilizer (OIS) function, a mechanical shutter function, etc.

However, if the electric component is mounted to the plurality of lenses, it requires that the electric component has to be electrically connected to a printed circuit board (PCB), which connects a sensor chip, such as a CMOS image sensor, disposed below the plurality of lenses to the external electronic device.

As methods for connecting the electric component mounted to the plurality of lenses to the PCB, there are known a multi-layer wire bonding method, a via interconnection method, etc.

The multi-layer wire bonding method does not only increase a size in plane X-Y due to structural characteristic requiring wires, but also has to perform a wire bonding process to each individual module. Thus, the multi-layer wire bonding method presents a problem in that it is difficult to miniaturize the image sensor module to conform to the condition required in the electronic device, fabrication cost is increased and productivity is reduced. Also, the via interconnection method needs complicated processes for forming via interconnections, such as a process of forming via holes and via interconnection in a plurality of glass substrates each forming a lens, etc. Thus, the via interconnection method also presents a problem in that fabrication cost is increased and productivity is reduced.

Accordingly, the conventional methods as described above have a limit in embodying or commercializing the image sensor module in which the electric component is mounted to carry out the various functions to the plurality of lenses.

SUMMARY OF THE INVENTION

Exemplary embodiment of the present invention addresses at least the above aspects. Accordingly, an aspect of the present invention is to provide an image sensor module capable of mounting an electric component to adjust optical characteristic of lenses without increasing a size as well as without increasing fabrication cost or reducing productivity, and a fabrication method thereof.

Additional aspects of the invention will be set forth in part in the description which follows and, in part, will be obvious from the description, or may be learned by practice of the invention.

According to one aspect of an exemplary embodiment of the present invention, there is provided an image sensor module including a sensor chip; at least one lens disposed above the sensor chip; at least one electric component disposed with respect to the at least one lens to adjust optical characteristics of the at least one lens; a housing accommodating and closing up the sensor chip, the at least one lens and the at least one electric component, and having an opening to expose the at least one lens to an outside thereof, and a wiring part longitudinally disposed on an inner surface of the housing, and including at least one conducting wire having a first connecting terminal exposed to the outside of the housing to allow the at least one conducting wire to electrically connect a terminal pad of the at least one electric component with an external electronic device and a second connecting terminal connected to the terminal pad of the at least one electric component.

Here, the first connecting terminal may be bent onto a bottom surface of the housing at a lower part of the inner surface of the housing and exposed to the outside of the housing, and the second connecting terminal may be projected toward the terminal pad of the at least one electric component from the inner surface of the housing to elastically connect in contact with the terminal pad of the at least one electric component, and formed of an elongated plate type spring elastically contractible. At this time, preferably but, not necessarily, the second connecting terminal may be formed in an upwardly and downwardly inclined triangle shape, and an anisotropic conducting film (ACF) patch may be disposed on the terminal pad of the electric component opposite to the second connecting terminal, so that when pressed in contact with and by the second connecting terminal, the ACF patch electrically connects between the second connecting terminal and the terminal pad of the electric component.

To easily insert and join the censer chip, the at least one lens and the at least one electric component into and in the housing, preferably but, not necessarily, the censer chip, the at least one lens and the at least one electric component may be formed in a tetragon shape, and the housing is formed in a tetragonal tub shape.

The image sensor module may further include a substrate to connect the at least one terminal pad of the sensor chip and the first connecting terminal of the at least one connecting wire to the external electronic device. In this case, preferably, but not necessarily, an ACF patch may be disposed on a terminal pad of the substrate opposite to the first connecting terminal, so that when pressed in contact with and by the first connecting terminal, the ACF patch electrically connects between the first connecting terminal and the terminal pad of the substrate. Also, preferably, but not necessarily, an ACF patch is disposed on a terminal pad of the substrate opposite to the at least one terminal pad of the sensor chip, so that when pressed in contact with and by the at least one terminal pad of the sensor chip, the ACF patch electrically connects between the at least one terminal pad of the sensor chip and the terminal pad of the substrate.

In an embodiment, the substrate may be a flexible printed circuit board (PCB) electrically and mechanically connected with the external electronic device, or a PCB connected in a surface mounting technology (SMT) with the external electronic device. The sensor chip may be a CMOS image sensor chip. The at least one lens may be at least two lens, each of which is formed of a spherical lens made of glass, or at least two lens, each of which is formed of an aspheric lens in which a convex lens or/and a concave lens made of polymer are bonded on an upper surface or/and a lower surface of a glass plate, respectively. The electric component may be an electric component for camera system to carry out an automatic focusing function, a zoom function, an optical image stabilizer (OIS) function, and a mechanical shutter function according to an electric signal.

According to another aspect of an exemplary embodiment of the present invention, there is provided a fabrication method of an image sensor module, including attaching a sensor chip/lens structure including a sensor chip, at least one lens and at least one electric component on a substrate; and inserting the sensor chip/lens structure into a housing and at the same time, joining the housing on the substrate to allow a wiring part formed on an inner surface of the housing to be connected to terminal pads of the at least one electric component.

Here, the attaching may include forming a first ACF patch on the substrate, and pressing and joining terminal pads of the sensor chip of the sensor chip/lens structure onto and on a first portion of the first ACF patch formed on corresponding terminal pads of the substrate.

The inserting and at the same time, joining may include aligning and arranging the housing with and above the sensor chip/lens structure, pressing the housing downward to allow the sensor chip/lens structure to be inserted into the housing, connecting first connecting terminals of a plurality of conducting wires of the wiring part bent onto a bottom surface of the housing at a lower part of the inner surface of the housing, to corresponding terminal pads of the substrate, and elastically connecting second connecting terminals of the plurality of conducting wires of the wiring part projected toward the terminal pads of the electric component from the inner surface of the housing, in contact with the terminal pads of the electric component.

In this case, preferably, but not necessarily, the connecting the first connecting terminals may include pressing the first connecting terminals onto a second portion of the first ACF patch formed on the corresponding terminal pads of the substrate to come in contact and join therewith, and the elastically connecting the second connecting terminals may include pressing the second connecting terminals onto a second ACF patch formed on the corresponding terminal pads of the electric component to come in contact and join therewith.

The inserting and at the same time, joining may further include joining the bottom surface of the housing with a third portion of the first ACF patch to seal therebetween.

Other objects, advantages, and salient features of the invention will become apparent to those skilled in the art from the following detailed description, which, taken in conjunction with the annexed drawings, discloses exemplary embodiment of the invention.

BRIEF DESCRIPTION OF THE DRAWINGS

The above aspects and features of the present invention will be more apparent from the description for exemplary embodiment of the present invention taken with reference to the accompanying drawings, in which.

Throughout the drawings, the same drawing reference numerals will be understood to refer to the same elements, features, and structures.

DETAILED DESCRIPTION OF ILLUSTRATIVE, NON-LIMITING EMBODIMENTS OF THE INVENTION

Figure 1:
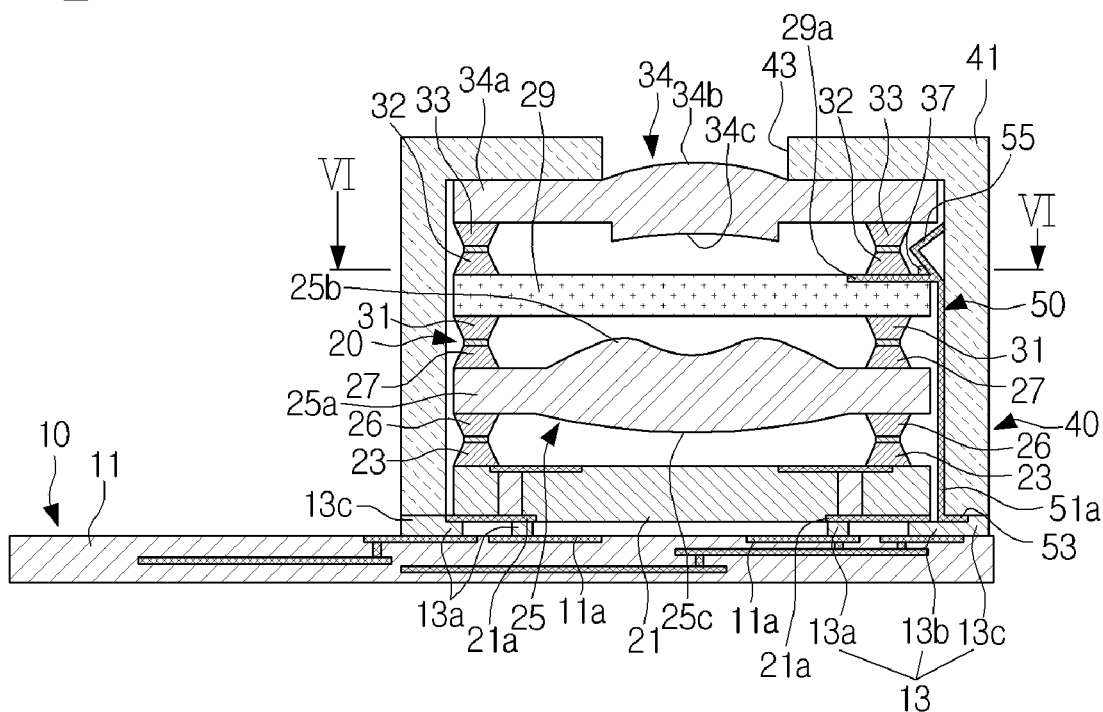
FIG. 1 is a cross-sectional view exemplifying an image sensor module in accordance with an exemplary embodiment of the present invention.

Reference will now be made in detail to an exemplary embodiment of the present invention, which are illustrated in the accompanying drawings, wherein like reference numerals refer to the like elements throughout. The exemplary embodiment is described below in order to explain the present invention by referring to the figures.

FIG. 1 is a cross-sectional view schematically exemplifying an image sensor module 1 in accordance with an exemplary embodiment of the present invention.

As illustrated in FIG. 1, the image sensor module 1 in accordance with the exemplary embodiment of the present invention includes a sensing structure 40 and a wiring part 50.

The sensing structure 40 is provided with a sensor chip 21, a plurality of lenses 25 and 34, an electric component 29, and a housing 41.

The sensor chip 21 is, for example, a chip containing a CMOS image sensor (CIS) and a controller to control the CIS therein, and at a lower surface thereof, has sensor chip terminal pads 21a connected with a wiring formed therein. A first upper spacer 23 is attached on an upper surface of the sensor chip 21 and joined with a first lower spacer 26 of a first lens 25 to be described later. The first upper and the first lower spacers 23 and 26 may be formed in a height, which is predetermined making allowance for a forcing surface, etc. of the first lens 25 or a second lens 34, by etching a silicon wafer or injection-molding a plastic material.

To electrically and mechanically connect the sensing structure 40 with a control and driving circuit of an external electronic device, such as a camera phone and the like, a substrate 10 is disposed below the sensor chip 21. The substrate 10 is formed of a flexible printed circuit board (PCB) 11. Alternatively, the substrate 10 may be formed of a PCB formed in the external electronic device to join the sensing structure 40 in a surface mounting technology (SMT) thereto.

Figure 3A:
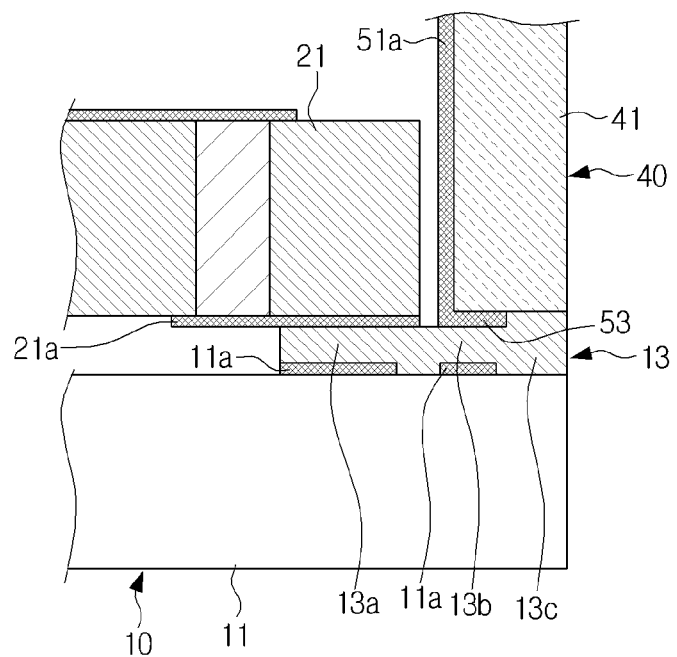
FIGS. 3A and 3B are partial cross-sectional views exemplifying first and second connecting terminals of an input conducting wire of a wiring part of the image sensor module illustrated in FIG. 1.
Figure 4A:
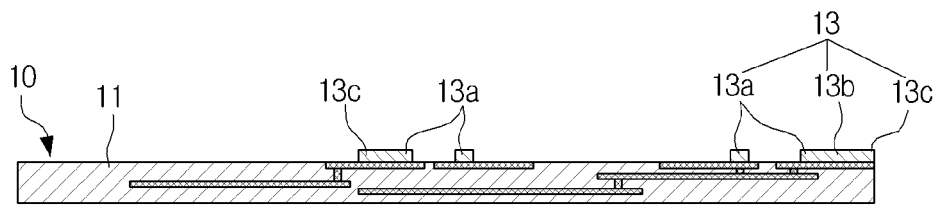
FIGS. 4A through 4C are cross-sectional views exemplifying a fabrication method of the image sensor module illustrated in FIG. 1.
Figure 4B:
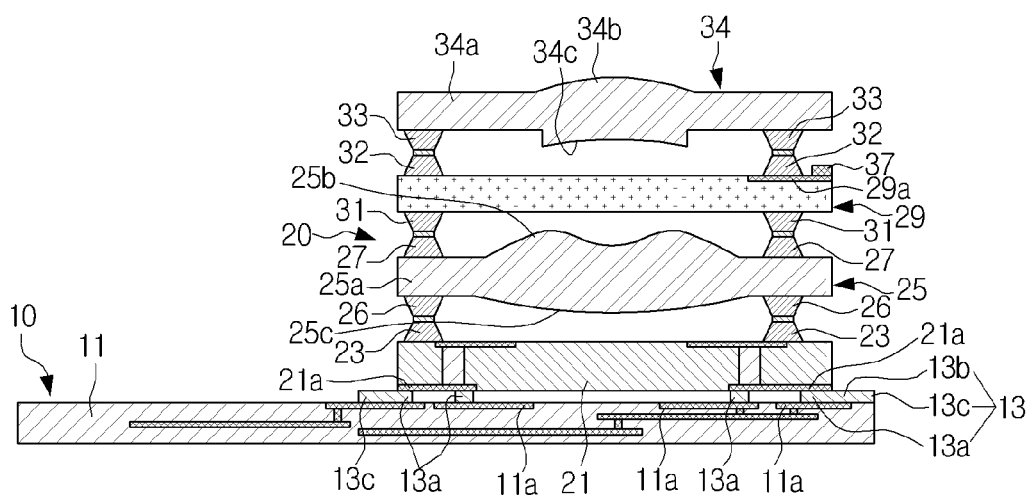
Figure 4C:
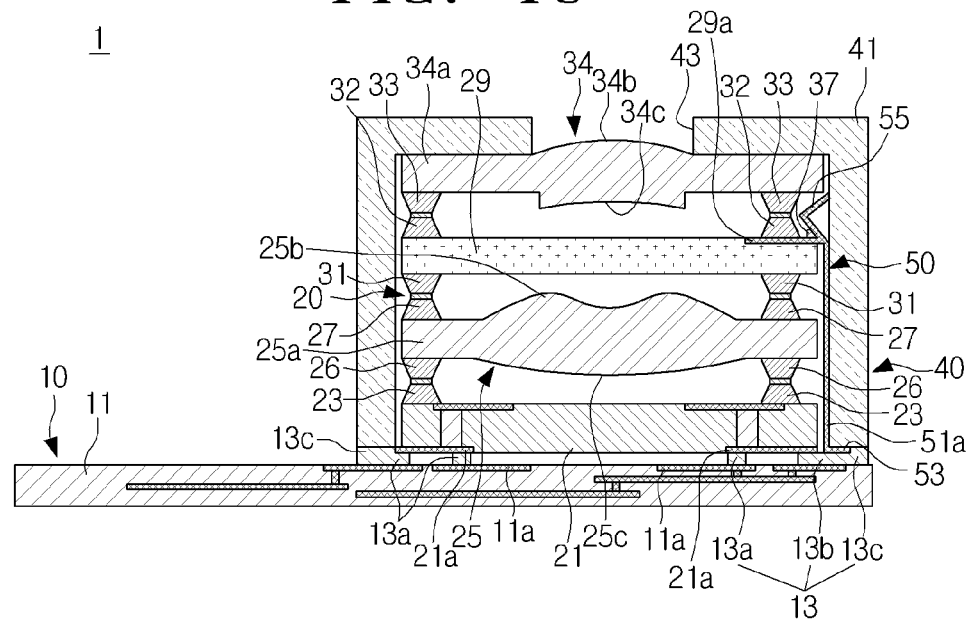

The sensor chip terminal pads 21a of the sensor chip 21 are connected with substrate terminal pads 11a of the substrate 10 through a first anisotropic conducting film (ACF) patch 13. The first ACF patch 13 may be formed of a photosensitive ACF or a general ACF, which includes an adhesive and conductive particles so that when pressed and deformed with a given pressure, it have an electric conductivity. The first ACF patch 13 functions to electrically and mechanically connect the substrate terminal pads 11a of the substrate 10 to corresponding sensor chip terminal pads 21a of the sensor chip 21 and first connecting terminals 53 of input, output and ground-conducting wires 51a, 51b, and 51c (see FIGS. 6A, 6B and 6C) of the wiring part 50 to be described later, and to sealingly bond a lower surface of the housing 41 to the substrate 10. For this, as illustrated in FIGS. 1, 3A and 4B, the first ACF patch 13 has a first portion 13a electrically connected with the sensor chip terminal pads 21a when it is pressed by the sensor chip terminal pads 21a while coming therewith, a second portion 13b electrically connected with the first connecting terminals 53 of the input, output and ground-conducting wires 51a, 51b, and 51c of the wiring part 50 when it is pressed by the first connecting terminals 53 while coming therewith, and a third portion 13c to sealingly bond the lower surface of the housing 41 to the substrate 10.

The plurality of lens 25 and 34 is made up of, for example, first and second lenses 25 and 34. Each of the first and the second lenses 25 and 34 may be formed of a spherical lens in the form of a tetragonal shape made of glass, or an aspheric lens in the form of a tetragonal shape in which a convex lens or/and a concave lens made of polymer are bonded on an upper surface or/and a lower surface of a flat glass plate, respectively. In the exemplary embodiment, the first lens 25 is formed of an aspheric lens in the form of a tetragonal shape in which a concave and a convex lenses 25b and 25c made of polymer are bonded on centers of upper and lower surfaces of a flat glass plate 25a, respectively. The second lens 34 is formed of an aspheric lens in the form of a tetragonal shape in which a convex and a concave lenses 34b and 34c made of polymer are bonded on centers of upper and lower surfaces of a flat glass plate 34a, respectively.

The first lens 25 is adhered and supported on the first upper spacer 23 of the sensor chip 21 by the first lower spacer 26 and to a second lower spacer 31 by a second upper spacer 27 made of silicon or plastic material. The first lower and the second upper spacers 26 and 27 may be formed in a height, which is predetermined making allowance for a forcing surface, etc. of the second lens 34, by etching a silicon wafer or injection-molding a plastic material. The second lens 34 is adhered and supported on a third upper spacer 32 of the electric component 29 by a third lower spacer 33 made of silicon or plastic material. The third lower spacer 33 may be also formed in a predetermined height by etching a silicon wafer or injection-molding a plastic material.

The electric component 29 adjusts optical characteristics of the first and the second lenses 25 and 34, and is driven according to an electric signal of the control and driving circuit of the external electronic device, which is transmitted through the substrate 10 and the wiring part 50 to be described in detail below. The electric component 29 may be an electric component for camera system including an adjusting lens (not illustrated) coaxially aligned with the first and the second lenses 25 and 34 and a driving part (not illustrated) from driving the adjusting lens up and down and/or left and right to carry out an automatic focusing function, a zoom function, an optical image stabilizer (OIS) function, a mechanical shutter function, etc. according to the electric signal. Since constructions and operations of the adjusting lens and the driving part of the electric component 29 are the same as those of the adjusting lens and the driving part of the conventional electric component, detailed description thereof will be omitted.

Figure 3B:
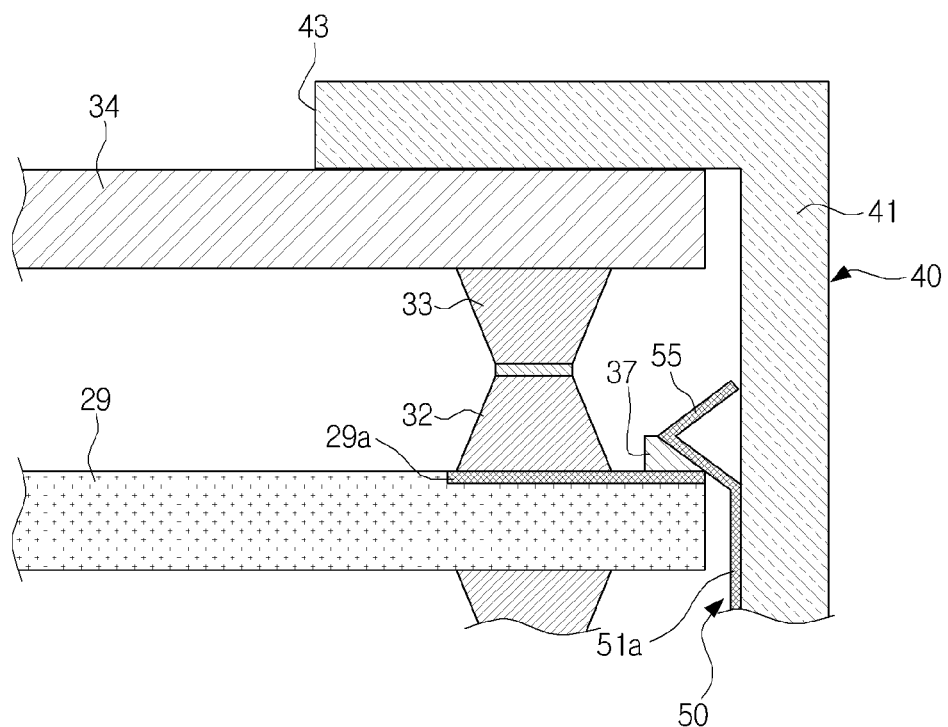
Figure 6A:
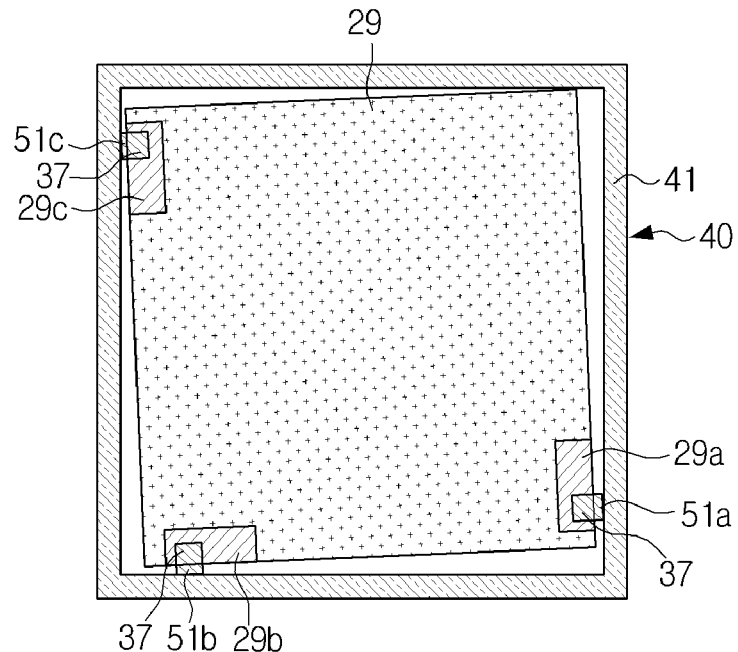
FIGS. 6A through 6C are cross-sectional views taken along line VI-VI of FIG. 1, exemplifying a connecting relation between second connecting terminals of input, output and ground conducting wires of the wiring part and input, output and ground terminal pads of an electric component of the image sensor module illustrated in FIG. 1.
Figure 6B:
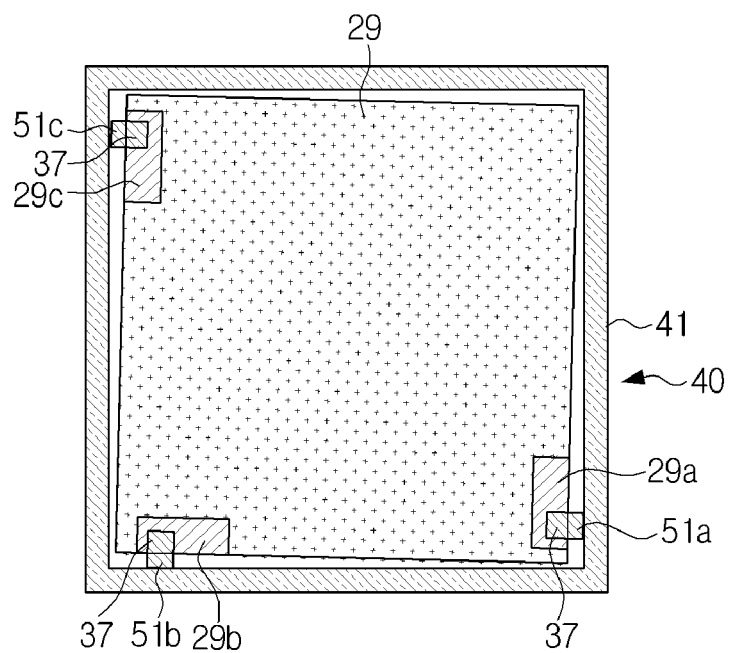

As illustrated in FIGS. 3B, 6A and 6B, the electric component 29 at an upper surface thereof has a plurality of electric component terminal pads, that is, input and output terminal pads 29a and 29b for inputting and outputting the electric signal and a ground terminal pad 29c for grounding the electric component 29. A second ACF patch 37 is formed on the input, the output, and the ground terminal pads 29a, 29b and 29c, so that when pressed in contact with and by the second connecting terminals 55 of input, output and ground conducting wires 51a, 51b and 51c of the wiring part 50 to be described below, it electrically connects therebetween. Accordingly, the input, the output, and the ground terminal pads 29a, 29b and 29c are electrically connected to the control and driving circuit of the external electronic device via the substrate 10 through the input, the output and the ground conducting wires 51a, 51b and 51c of the wiring part 50.

Figure 2:
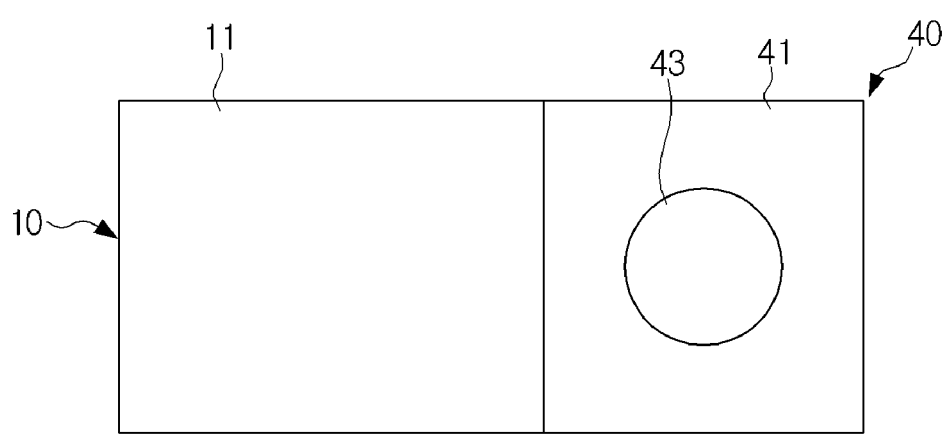
FIG. 2 is a top plan view exemplifying the image sensor module illustrated in FIG. 1.

The housing 41 acts as a lens adapter for closing up components of the sensing structure 40 to block light and contaminants from entering through paths except the first and the second lenses 25 and 34, and is bonded on the substrate 10 by the third portion 13c of the first ACF patch 13. As illustrated in FIG. 2, the housing 41 at an upper part thereof has an opening 43 to expose the second lens 34 to an outside thereof and at a lower part thereof is formed in a tetragonal tub shape. Since the housing 41 is formed in the tetragonal tub shape, it can provide easy mechanical alignment and combination, thereby simplifying fabrication process, when joined with a sensor chip/lens structure 20 including the censer chip 21, the first and the second lenses 25 and 34 and the electric component 29, which are formed in a tetragon shape.

The wiring part 50 is longitudinally disposed on an inner surface of the housing 41, and has a plurality of conducting wire, that is, the input, the output and the ground conducting wires 51a, 51b and 51c to electrically connect the input and the output and the ground terminal pads 29a, 29b and 29c of the electric component 29 to the corresponding substrate terminal pads 11a of the substrate 10, respectively.

As illustrated in FIG. 1, the input conducting wire 51a is formed of an elongated plate type spring made in a given width with a metal, such as kappa, Au, and Ag, and has first and second connecting terminals 53 and 55. To easily assemble the housing 41 and the sensor chip/lens structure 20 in fabrication, the input conducting wire 51a is configured to have a thickness smaller than a gap between the inner surface of the housing 41 and the sensor chip/lens structure 20, particularly, the electric component 29, making allowance for fabrication tolerance of the housing 41, dicing tolerance of the sensor chip 21, the first and the second lenses 25 and 34 and the electric component 29, etc. Here, the gap between the inner surface of the housing 41 and the sensor chip/lens structure 20 may be designed in the range of below 200 µm. Accordingly, even though the input conducting wire 51a is additionally installed, the housing 51 does not increase in height and width, and thus the image sensor module 1 does not increase in size.

As illustrated in FIG. 3A, the first connecting terminal 53 of the input conducting wire 51a is bent onto a bottom surface of the housing 41 at a lower part of an inner surface of one side wall of the housing 41 to connect with the corresponding the substrate terminal pad 11a of the substrate 29.

Figure 5A:
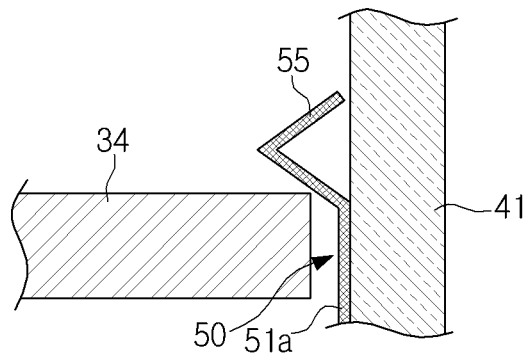
FIGS. 5A through 5C are partial cross-sectional views exemplifying an operation when the second connecting terminal of the input conducting wire of the wiring part of the image sensor module illustrated in FIG. 1 passes through a side surface of a second lens.
Figure 5B:
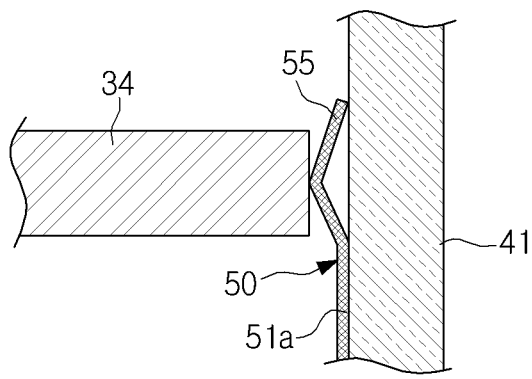
Figure 5C:
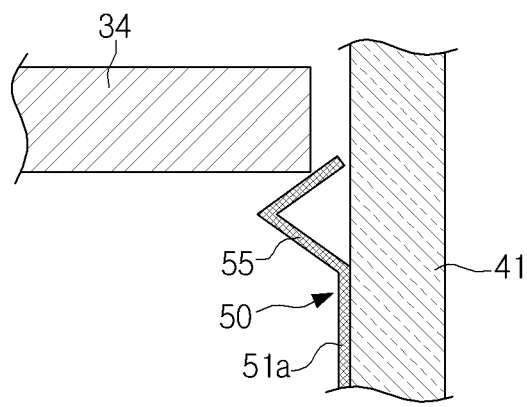

As illustrated in FIG. 3B, the second connecting terminal 55 of the input conducting wire 51a is projected toward the corresponding terminal pad 29a of the electric component 29 from the inner surface of the one side wall of the housing 41 to elastically connect in contact with the terminal pad 29a of the electric component 29, and is configured to be elastically contractible while being pushed by a corresponding side surface of the second lenses 34 when the sensor chip/lens structure 20 is assembled in the housing 41, as explained later with reference to FIGS. 5A through 5C. For this, preferably, but not necessarily, the second connecting terminal 55 is configured to have an upwardly and downwardly inclined triangle shape.

As explained with reference to the substrate 10 above, the first ACF patch 13 is adhered on the substrate terminal pads 11a of the substrate 10. Accordingly, when the housing 41 and the substrate 10 are joined each other, the second portion 13b of the first ACF patch 13 is pressed in contact with and by the first connecting terminal 53 of the input conducting wire 51a to electrically connect therewith, and thus the first connecting terminal 53 of the input conducting wire 51a is electrically connected with the corresponding substrate terminal pad 11a of the substrate 10 through the second portion 13b of the first ACF patch 13.

Figure 6C:
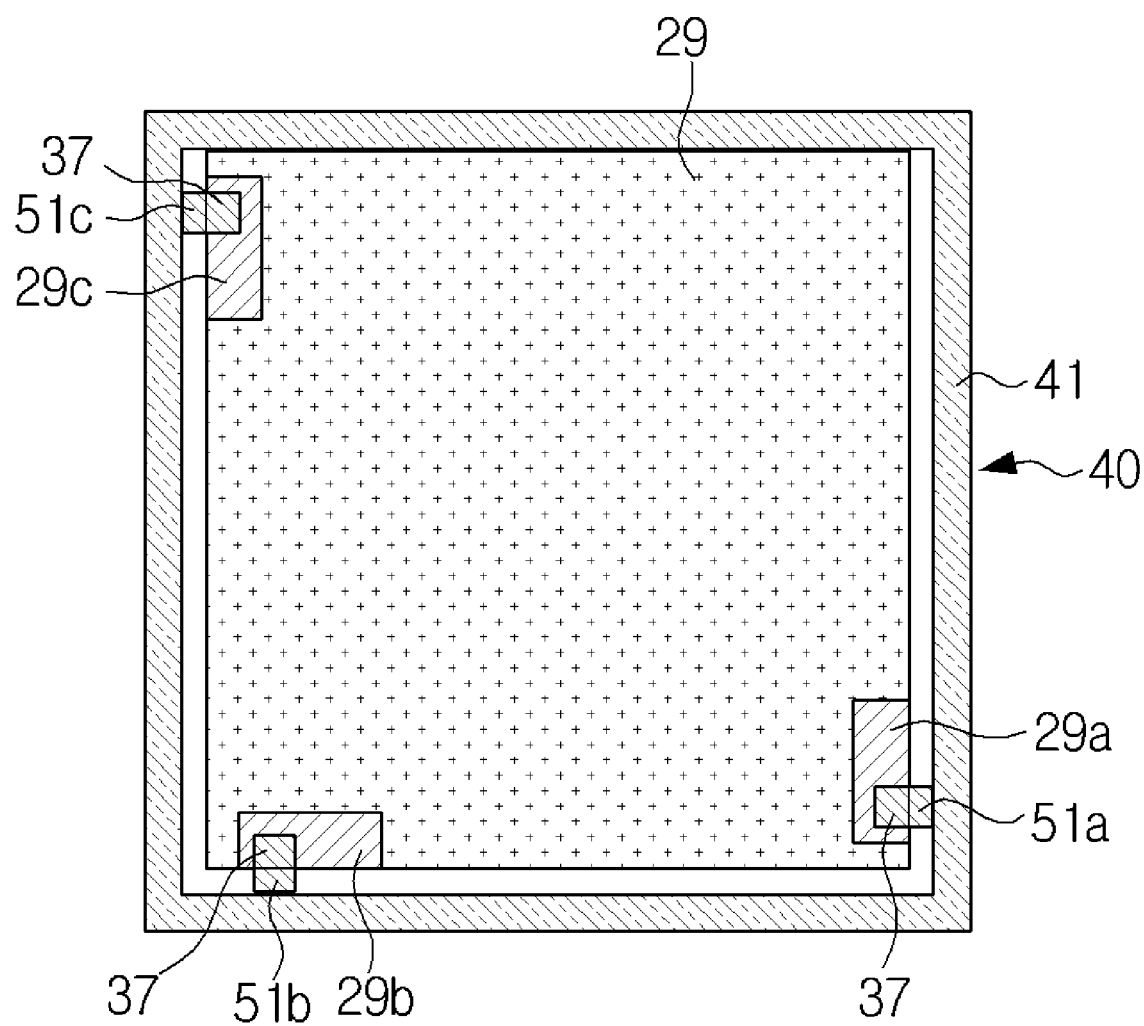

Also, the second ACF patch 37 is adhered on the input terminal pad 29a of the electric component 29 opposite to the second connecting terminal 55 of the input conducting wire 51a, which has an electric conductivity when pressed and deformed with a given pressure. Accordingly, when the housing 41 and the sensor chip/lens structure 20 are joined each other, the second ACF patch 37 is pressed in contact with and by the second connecting terminal 55 of the input conducting wire 51a to electrically connect therewith, and thus the input terminal pad 29a is electrically connected with the second connecting terminal 55 of the input conducting wire 51a through the second ACF patch 37. At this time, as illustrated in FIGS. 6A through 6C, because the gap between the inner surface of the housing 41 and the electric component 29 of the sensor chip/lens structure 20 is designed in the range of below 200 μm making allowance for fabrication tolerance of the housing 41, the dicing tolerance of the electric component 29, etc. and the input conducting wire 51a has a proper thickness below the gap range between the inner surface of the housing 41 and the electric component 29 of the sensor chip/lens structure 20, a case that the second connecting terminal 55 of the input conducting wire 51a is separated from the second ACF patch 37 so as not to come in contact therewith does not occur.

Since constructions of the output conducting wire 51b and the ground conducting wire 51c are the same as those of the input conducting wire 51a except for arranged positions, detailed description thereof will be omitted.

As described above, the wiring part 50 is formed on the inner surface of the side walls of the housing 41 within the housing 41 to have the thickness in the range of the gap range between the inner surface of the housing 41 and the sensor chip/lens structure 20. Accordingly, even though the wiring part 50 is additionally installed, it does not increase the housing 41 and the image sensor module 1 in size, and can electrically connect the input, the output and the ground conducting wires 29a, 29b, and 29c of the electric component 29 to the corresponding substrate terminal pad 11a of the substrate 10 only by assembling the housing 41 with the sensor chip/lens structure 20 and bonding the housing 41 on the substrate 10 through the first ACF patch 13.

In the above description, although the image sensor module 1 according to the exemplary embodiment of the present invention is explained and illustrated as including the sensing structure 40 made up of the first and the second lenses 25 and 34 and the single electric component 29, the present invention is not limited thereto. That is, the sensing structure 40 may be configured to include more than three lenses and more than two electric components. In this case, each of conducting wires of a wiring part is configured to have more than two second connecting terminals.

Also, although the electric component 29 is explained and illustrated as disposed between the first and the second lenses 25 and 34, it may be disposed between the sensor chip 21 and the first lens 25 or on the second lens 34.

Hereinafter, a fabrication method of the image sensor module 1 according to the exemplary embodiment of the present invention constructed as described above will be explained.

First, to electrically and mechanically connect and join a sensing structure 40 including the sensor chip 21, the first and the second lenses 25 and 34, and the electric component 29 to a substrate 10, a photosensitive ACF (not illustrated) is adhered on a whole surface of the substrate 10 prepared in advance. Subsequently, the photosensitive ACF is exposed by an exposure process of using an exposure mask (not illustrated) with a first ACF patch pattern and then etched. As a result, as illustrated in FIG. 4A, a first ACF patch 13 with first, second and third portions 13a, 13b and 13c is formed on the substrate 10.

Here, alternatively, if a general ACF is used instead of the photosensitive ACF, it is patterned by a photolithography process of using an etching mask with a first ACF patch pattern formed of photoresist to form the first ACF patch 13.

After the first ACF patch 13 is formed on the substrate 10, as illustrated in FIG. 4B, a sensor chip/lens structure 20 prepared in advance is joined on the substrate 10. That is, sensor chip pads 21a of the sensor chip 21 are pressed on a first portion 13a of the first ACF patch 13 formed on substrate terminal pads 11a of the substrate 10 in a certain pressure, so that the sensor chip pads 21a of the sensor chip 21 are joined and electrically connected with the substrate terminal pads 11a of the substrate 10 through the first portion 13a of the first ACF patch 13.

Here, the sensor chip/lens structure 20 may be fabricated in advance by making a sensor chip wafer (not illustrated) in which a plurality of sensor chips 21 and a plurality of first upper spacers 23 are formed, a first lens wafer (not illustrated) in which a plurality of first lenses 25 and a plurality of first lower and second upper spacers 26 and 27 are formed, an electric component wafer (not illustrated) In which a plurality of electric components 29 and a plurality of second lower and third upper spacers 31 and 32 are formed, and a second lens wafer (not illustrated) in which a plurality of second lenses 34 and a plurality of third lower spacers 33 are formed, respectively, in a wafer level, bonding between the first upper spacers 23 and the first lower spacers 26, between the second upper spacers 27 and the second lower spacers 31, and between the third upper spacers 32 and the third lower spacers 33, respectively, and then dicing the bonded wafer structure to form individual sensor chip/lens structure 20.

After the sensor chip/lens structure 20 is joined on the substrate 10, to combine the housing 41 and the sensor chip/lens structure 20 each other and join the housing on the substrate 10, the housing 41 is aligned with the sensor chip/lens structure 20 and arranged above the sensor chip/lens structure 20. That is, as illustrated in FIG. 2, because the housing 41 and the sensor chip/lens structure 20 are formed in the tetragonal shape, they can be easily aligned each other.

And then, the housing 41 is pressed downward toward the substrate 10 to allow the sensor chip/lens structure 20 to be inserted into the housing 41. As the housing 41 is descended downward, second connecting terminals 55 of input, output and ground conducting wires 51a, 51b and 51c projected toward input, output and ground terminal pads 29a, 29b and 29c of the electric component 29 from inner surfaces of side walls of the housing 41 come in contact with corresponding side surfaces of the second lens 34, as illustrated in FIG. 5A. At this time, when the housing 41 is further descended downward, the second connecting terminals 55 are elastically contracted from a state illustrated in FIG. 5A to a state illustrated in FIG. 5B by the corresponding side surfaces of the second lens 34. After the side surfaces of the second lens 34 passes through the second connecting terminals 55, the second connecting terminals 55 are restored and returned again in a state illustrated in FIG. 5C.

And then, as the housing 41 is more descended downward, the second connecting terminals 55 of the input, the output and the ground conducting wires 51a, 51b and 51c come in contact with a second ACF patch 37 formed on the input, the output and the ground terminal pads 29a, 29b and 29c of the electric component 29 and presses the second ACF patch 37 in a certain pressure. At this time, because the housing 41 is formed so that the gap between the housing 41 and the sensor chip/lens structure 20, particularly, the electric component 29 is in the range of below 200 µm making allowance for fabrication tolerance of the sensor chip/lens structure 20, the second connecting terminals 55 of the input, the output and the ground conducting wires 51a, 51b and 51c sufficiently come in contact with the second ACF patch 37 only with combination operation between the sensor chip/lens structure 20 and the housing 41 thus to press the second ACF patch 37, as illustrated in FIGS. 6A through 6C. As a result, the second connecting terminals 55 of the input, the output and the ground conducting wires 51a, 51b and 51c electrically are connected with the input, the output and the ground terminal pads 29a, 29b and 29c of the electric component 29 due to the characteristic of the second ACF patch 37 having the electric conductivity when pressed and deformed with a given pressure.

Also, at this time, as illustrated in FIG. 3A, first connecting terminals 53 of the input, the output and the ground conducting wires 51a, 51b and 51c bent onto a bottom surface of the housing 41 at lower parts of the inner surfaces of the side walls of the housing 41 come in contact with a second portion 13b of the first ACF patch 13 formed on the corresponding substrate terminal pads 11a of the substrate 10 to press the second portion 13b of the first ACF patch 13. As a result, the first connecting terminals 53 of the input, the output and the ground conducting wires 51a, 51b and 51c are electrically connected with the corresponding substrate terminal pads 11a of the substrate 10 through the second portion 13b of the first ACF patch 13. Also, the bottom surface of the housing 41 does not greatly press a third portion 13c of the first ACF patch 13, but is bonded with the third portion 13c of the first ACF patch 13 to seal therebetween. As a result, the fabrication of the image sensor module 1 is completed.

Although an exemplary embodiment of the present invention has been shown and described, it will be appreciated by those skilled in the art that changes may be made in these embodiments without departing from the principles and spirit of the invention, the scope of which is defined in the claims and their equivalents.

What is claimed is:

1. An image sensor module comprising:
   a sensor chip;
   at least one lens disposed above the sensor chip;
   at least one electric component disposed with respect to the at least one lens to adjust optical characteristics of the at least one lens;
   a housing accommodating and closing up the sensor chip, the at least one lens and the at least one electric component, and having an opening to expose the at least one lens to an outside thereof; and
   a wiring part longitudinally disposed on an inner surface of the housing, and including at least one conducting wire having a first connecting terminal exposed to the outside of the housing to allow the at least one conducting wire to electrically connect a terminal pad of the at least one electric component with an external electronic device and a second connecting terminal connected to the terminal pad of the at least one electric component.

2. The module as claimed in claim 1, wherein the first connecting terminal is bent onto a bottom surface of the housing at a lower part of the inner surface of the housing and exposed to the outside of the housing, and the second connecting terminal is elastically contractible and projected toward the terminal pad of the at least one electric component from the inner surface of the housing to elastically connect in contact with the terminal pad of the at least one electric component.

3. The module as claimed in claim 2, wherein the conducting wire comprises an elongated plate type spring.

4. The module as claimed in claim 3, wherein the second connecting terminal is formed in an upwardly and downwardly inclined triangle shape.

5. The module as claimed in claim 2, wherein an anisotropic conducting film (ACF) patch is disposed on the terminal pad of the electric component opposite to the second connecting terminal, so that when pressed in contact with and by the second connecting terminal, the ACF patch electrically connects between the second connecting terminal and the terminal pad of the electric component.

6. The module as claimed in claim 1, wherein the censer chip, the at least one lens and the at least one electric component are formed in a tetragon shape, and the housing is formed in a tetragonal tub shape.

7. The module as claimed in claim 1, further comprising a substrate to connect at least one terminal pad of the sensor chip and the first connecting terminal of the connecting wire to the external electronic device.

8. The module as claimed in claim 7, wherein an ACF patch is disposed on a terminal pad of the substrate opposite to the first connecting terminal, so that when pressed in contact with and by the first connecting terminal, the ACF patch electrically connects between the first connecting terminal and the terminal pad of the substrate.

9. The module as claimed in claim 8, wherein an ACF patch is disposed on a terminal pad of the substrate opposite to the at least one terminal pad of the sensor chip, so that when pressed in contact with and by the at least one terminal pad of the sensor chip, the ACF patch electrically connects between the at least one terminal pad of the sensor chip and the terminal pad of the substrate.

10. The module as claimed in claim 7, wherein the substrate comprises a flexible printed circuit board (PCB) electrically and mechanically connected with the external electronic device, or a PCB connected in a surface mounting technology (SMT) with the external electronic device.

11. The module as claimed in claim 1, wherein the sensor chip comprises a CMOS image sensor chip.

12. The module as claimed in claim 1, wherein the at least one lens comprises at least two lens, each of which is formed of a spherical lens made of glass, or at least two lens, each of which is formed of an aspheric lens in which a convex lens or/and a concave lens made of polymer are bonded on an upper surface or/and a lower surface of a glass plate, respectively.

13. The module as claimed in claim 1, wherein the electric component comprises an electric component for camera system to carry out an automatic focusing function, a zoom function, an optical image stabilizer (OIS) function, a mechanical shutter function, etc. according to an electric signal.

14. A fabrication method of an image sensor module, comprising:

attaching a sensor chip/lens structure including a sensor chip, at least one lens and at least one electric component on a substrate; and inserting the sensor chip/lens structure into a housing and at the same time, joining the housing on the substrate to allow a wiring part formed on an inner surface of the housing to be connected to terminal pads of the at least one electric component.

15. The fabrication method as claimed in claim 14, wherein the attaching comprises:

forming a first ACF patch on the substrate; and pressing and joining terminal pads of the sensor chip of the sensor chip/lens structure onto and on a first portion of the first ACF patch formed on corresponding terminal pads of the substrate.

16. The fabrication method as claimed in claim 15, wherein the inserting and at the same time, joining comprises:

aligning and arranging the housing with and above the sensor chip/lens structure;

pressing the housing downward to allow the sensor chip/lens structure to be inserted into the housing;

connecting first connecting terminals of a plurality of conducting wires of the wiring part bent onto a bottom surface of the housing at a lower part of the inner surface of the housing, to corresponding terminal pads of the substrate; and elastically connecting second connecting terminals of the plurality of conducting wires of the wiring part projected toward the terminal pads of the electric component from the inner surface of the housing, in contact with the terminal pads of the electric component.

17. The fabrication method as claimed in claim 16, wherein the connecting the first connecting terminals comprises pressing the first connecting terminals onto a second portion of the first ACF patch formed on the corresponding terminal pads of the substrate to come in contact and join therewith.

18. The fabrication method as claimed in claim 17, wherein the elastically connecting the second connecting terminals comprises pressing the second connecting terminals onto a second ACF patch formed on the terminal pads of the electric component to come in contact and join therewith.

19. The fabrication method as claimed in claim 16, wherein the inserting and at the same time, joining further comprises joining the bottom surface of the housing with a third portion of the first ACF patch to seal therebetween.

* * * * *